United States Patent [19]

Ishii

[11] Patent Number: 5,065,222
[45] Date of Patent: Nov. 12, 1991

[54] SEMICONDUCTOR DEVICE HAVING TWO-LAYERED PASSIVATION FILM

[75] Inventor: Kazutoshi Ishii, Tokyo, Japan

[73] Assignee: Seiko Instruments Inc., Japan

[21] Appl. No.: 269,434

[22] Filed: Nov. 9, 1988

[30] Foreign Application Priority Data

Nov. 11, 1987 [JP] Japan ................................. 62-284860
Feb. 9, 1988 [JP] Japan ................................. 63-28172

[51] Int. Cl.$^5$ ............................................ H01L 29/34
[52] U.S. Cl. ...................................... 357/52; 357/54; 357/23.1; 357/23.11; 357/23.15
[58] Field of Search .................... 357/52 C, 52, 54 N, 357/54 G, 54, 23.1, 23.9, 23.11, 23.15, 41

[56] References Cited

U.S. PATENT DOCUMENTS

| 4,413,272 | 11/1983 | Mochizuki et al. | 357/54 |
| 4,621,277 | 11/1986 | Ito et al. | 357/54 |
| 4,628,590 | 12/1986 | Udo et al. | 357/54 |
| 4,835,597 | 5/1989 | Okuyama et al. | 357/52 |

FOREIGN PATENT DOCUMENTS

| 53-65066 | 6/1978 | Japan | 357/54 |
| 55-41784 | 3/1980 | Japan | 357/54 G |
| 0208162 | 12/1982 | Japan | 357/52 |
| 0033859 | 2/1984 | Japan | 357/52 |
| 0110122 | 6/1984 | Japan | 357/52 C |
| 0144362 | 6/1987 | Japan | 357/52 |
| 2027273 | 2/1980 | United Kingdom | 357/54 N |
| 2092376 | 8/1982 | United Kingdom | 357/54 G |

OTHER PUBLICATIONS

Mitsuhashi et al., "Mechanical Stress and Hydrogen Effects on Hot Carrier Injection", IEDM, 1986.
Marrello et al., "Amorphous Dielectric Films of BaTiO$_3$ and Related Materials", IBM Technical Disclosure Bulletin, vol. 19, No. 6, Nov. 1976.
Bratter et al., "Dielectric Structure as an Out-Diffusion Barrier", IBM Technical Disclosure Bulletin, vol. No. 6, 11/70.

Primary Examiner—Rolf Hille
Assistant Examiner—Minhloan Train
Attorney, Agent, or Firm—Bruce L. Adams; Van C. Wilks

[57] ABSTRACT

A passivation film of MOS semiconductor device is composed of a first passivation layer and a second passivation layer formed on the first passivation layer. The first passivation layer comprises silicon dioxide containing phosphorus in 0.5 percent or less and having a film thickness of 1500 Å or more. The second passivation layer comprises silicon oxynitride or silicon nitride.

11 Claims, 4 Drawing Sheets

SEMICONDUCTOR DEVICE HAVING TWO-LAYERED PASSIVATION FILM

BACKGROUND OF THE INVENTION

1. Field of the Invention

The present invention relates to a semiconductor device forming an integrated circuit used for electronic equipment.

2. Description of the Related Art

As shown in FIG. 2, a passivation film 11 formed on aluminum wirings 7 and 8 of a MOS type semiconductor device has conventionally employed a silicon nitride. The passivation film 11 is a water-resistant.

However, with the MOS type semiconductor device using the silicon nitride layer as the passivation layer, hydrogen in the silicon nitride layer diffuses to a gate oxide layer 4 so that hot electrons produced in the vicinity of a drain region 3 are liable to be trapped by the gate oxide layer. As a result, there is a problem that a MOS transistor is deteriorated with aging. In particular, a micro-processed MOS transistor wherein hot electrons are liable to be produced is greatly deteriorated. J. Mitsuhashi et al. points out the problem in "Mechanical Stress and Hydrogen Effects on Hot Carrier Injection" IEDM, 1986, Technical Digest, pp 386.

SUMMARY OF THE INVENTION

In order to solve the above mentioned problem of prior art, an object of the present invention is to provide a MOS semiconductor device wherein hot electron trap can be reduced and the reliability of the device can be improved.

In accordance with the present invention, there is provided a MOS semiconductor device comprising a semiconductor substrate of a first conductivity type, source and drain regions of a second conductivity type formed on the surface of the semiconductor substrate and spaced apart from each other, a gate electrode formed on the surface portion of the semiconductor substrate between the source and drain regions surrounded by a gate oxide layer with an internal insulation film covering at least the gate electrode, and a passivation film of double layers composed of a silicon dioxide layer having a large hydrogen diffusing coefficient and a silicon oxynitride or silicon nitride layer. The formation of the passivation layer composed of the double layers as described above eases a hydrogen dispersion from the silicon nitride to a gate oxide layer or mechanical stresses so that a hot electron trap is reduced to provide a reliable semiconductor device.

DETAILED DESCRIPTION OF THE INVENTION

The essential feature of the present invention is such that the passivation film has a double-layered structure comprised of a silicon dioxide layer having large hydrogen diffusion coefficient, and a silicon oxynitride or silicon nitride layer formed on the silicon dioxide layer.

Figure 1:
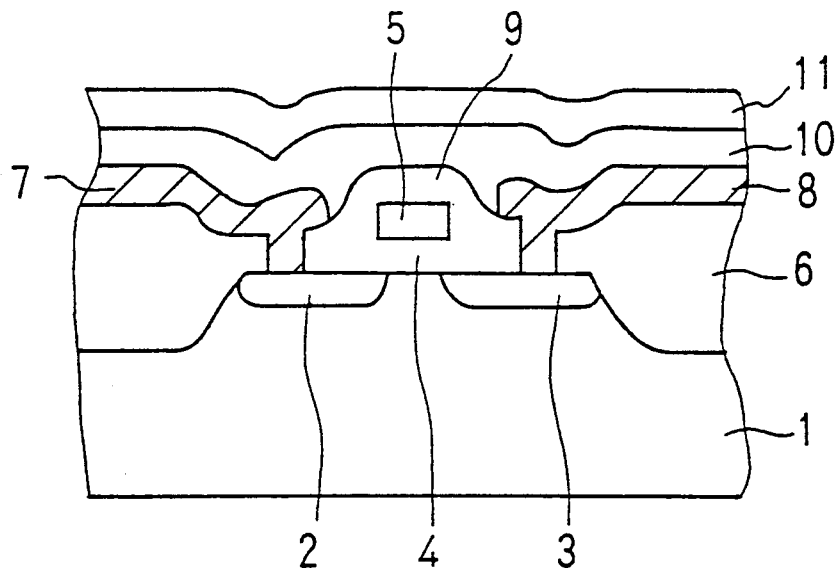
FIG. 1 is a cross sectional view of a semiconductor device according to the present invention.
Figure 2:
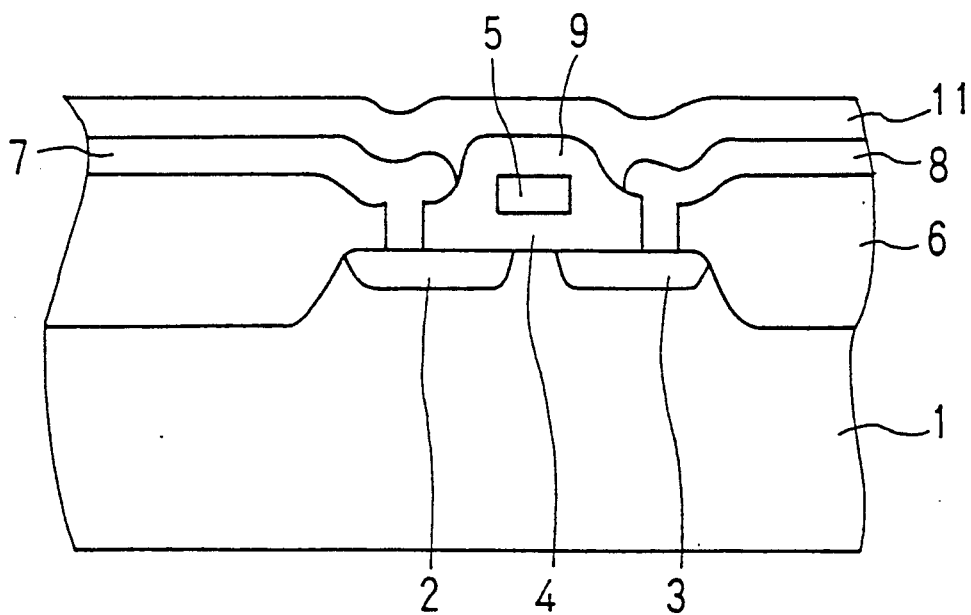
FIG. 2 is a cross sectional view of a conventional semiconductor device.
Figure 3:
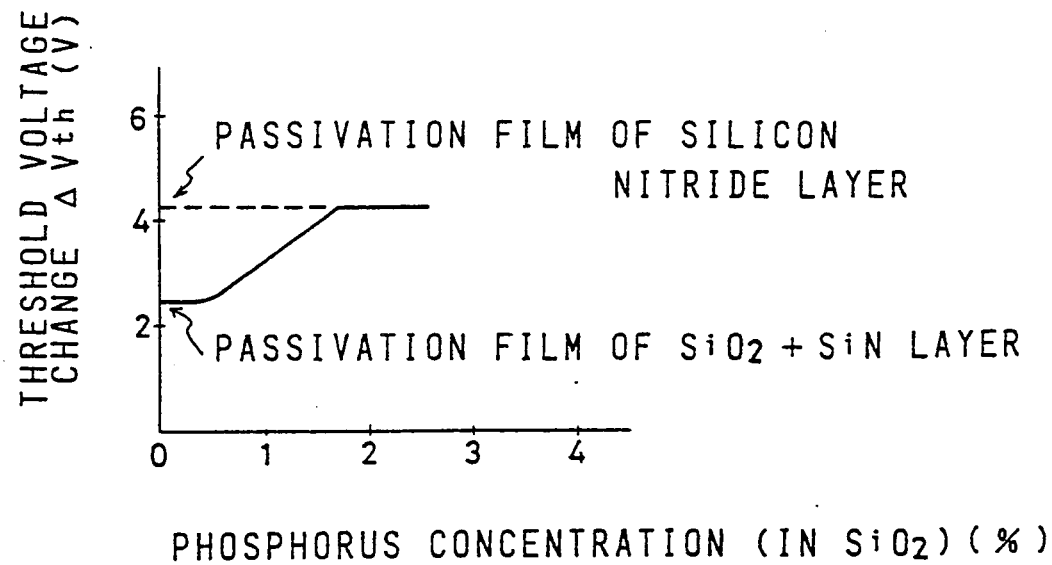
FIGS. 3 and 4 are a change in a threshold voltage caused by a hot electron trap vs. silicon concentration of a silicon oxide layer and a film thickness thereof.
Figure 4:
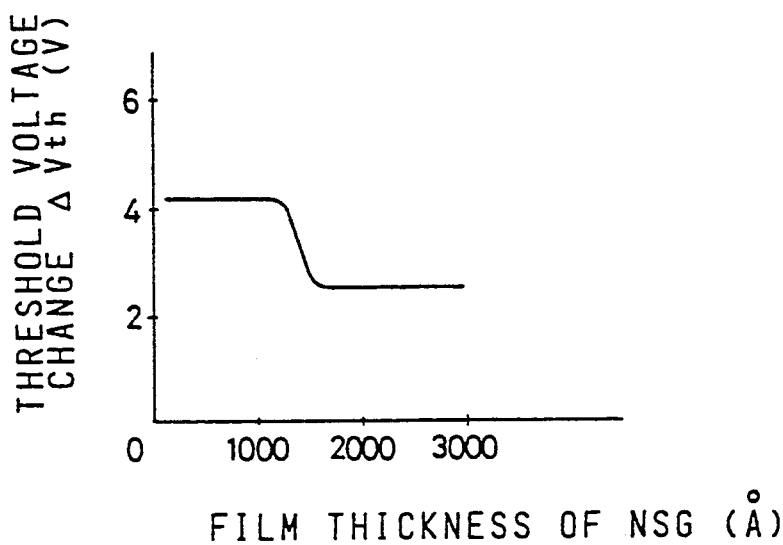
Figure 5:
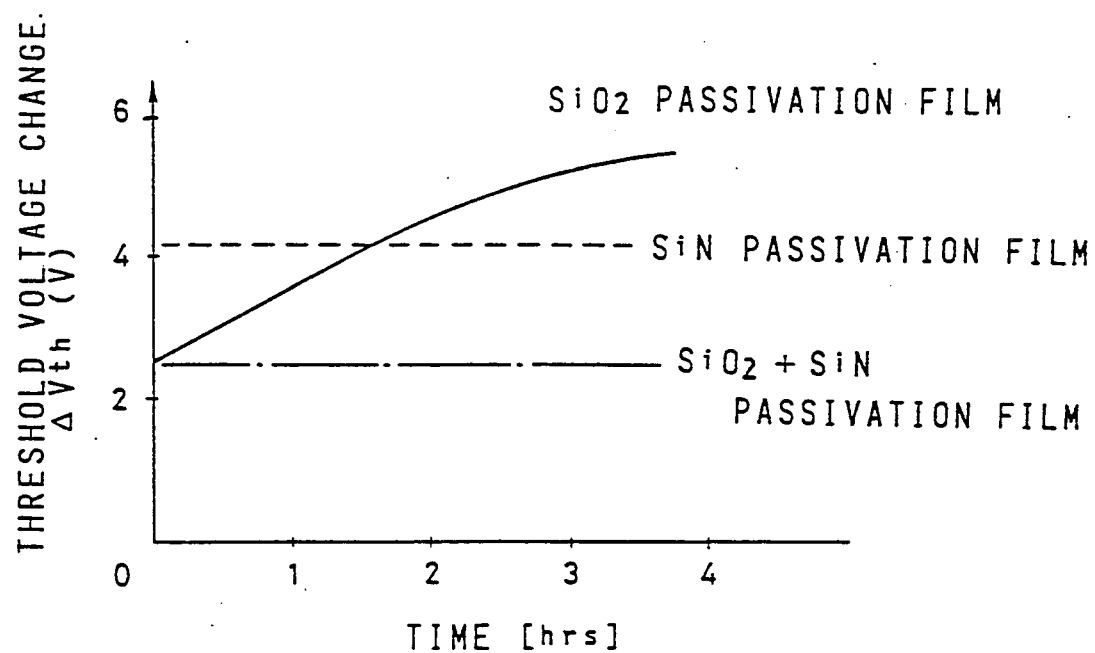
FIG. 5 is a change in a threshold voltage caused by a hot electron trap vs. a period of time a semiconductor device is exposed to an atmosphere of aqueous vapor.

An embodiment of the present invention will be described below with reference to drawings. FIG. 1 is a cross sectional view of a semiconductor device according to the present invention. An N+ type source region 2 and an N+ type drain region 3 are formed on a surface region of a P type silicon substrate 1 and a gate electrode 5 is formed on a channel region between the source region and the drain region through a gate oxide layer 4. An internal insulator film 9 (in general, phosphorus glass PSG or boron phosphorous glass BPSG) is formed on the gate electrode 5 and a first passivation layer 10 and a second passivation layer 11 are formed thereon. The passivation layers are formed to protect the semiconductor device from foreign substances such as water or the like entering from the outside. In particular, a silicon nitride layer or a silicon oxynitride layer is excellent as a layer for preventing the invasion of foreign substances from the outside because it is a layer of high density. The second passivation layer 11 is composed of a silicon nitride layer or a silicon oxynitride layer. The first passivation layer 10 is composed of a silicon dioxide layer. FIG. 3 shows a change in a threshold voltage of a MOS transistor under a hot electron producing condition vs. the phosphorus concentration of a silicon, oxide film. When the silicon dioxide layer of the first passivation layer 10 contains phosphorus in 0.5 percent or less, a most reliable semiconductor device with a least change in a threshold voltage is provided. The change in the threshold voltage has the same level as that of the case where there is no silicon nitride as the second passivation layer. More specifically, although a hot electron trap is increased by a passivation layer composed of silicon nitride which contains a lot of hydrogen causing the trap, its increase can be prevented by inserting a silicon dioxide layer containing phosphorus in 0.5 percent or less under the silicon nitride layer. FIG. 4 shows a change in a threshold voltage caused by a hot electron trap vs. a layer thickness of a silicon oxide layer (referred to as NSG because it contains less phosphorus concentration). When the NSG has a layer thickness greater than of 1500 Å or more, a semiconductor device with less hot electron trap affected by silicon nitride can be provided. In general, a silicon nitride layer increases the hot electron trap, but it is further increased in a particular circumstance even if there is no silicon nitride layer. FIG. 5 shows a change in a threshold voltage caused by hot electron traps when a semiconductor device is exposed to an atmosphere of aqueous vapor. When the semiconductor device is exposed to the aqueous vapor, hot electrons are liable to be trapped because H+ or OH− is invaded into the gate oxide layer 4. Therefore, the semiconductor device formed of the passivation layer composed of double layers, i.e., the silicon oxide layer and the silicon nitride layer, can restrict the hot electron trap when the device is exposed to aqueous vapor for a long time so that the present invention is more effective in such a case.

As described above, a semiconductor device according to the present embodiment is provided with a silicon oxide layer containing phosphorus in 0.5 percent or less and having a layer thickness of 1500 Å as a passivation layer formed under a silicon nitride layer causing hot electron trap so that the hot electron trap due to the silicon nitride layer can be reduced and the invasion of substances such as water or the like causing the hot electron trap from the outside is prevented by the silicon nitride layer deposited on the silicon dioxide layer, whereby the highly reliable semiconductor device is realized.

The present embodiment may be applicable to the case wherein a second passivation layer is composed of silicon oxynitride other than silicon nitride. In addition, the present invention is, suitably applied to a semiconductor device having many hot electrons produced therein, such as a micro-processing MOS transistor, a MOS transistor operable at a high voltage or a hot electron implantation non-volatile memory. Further, the present invention is not restricted to a dielectric layer of an oxide layer and a substrate of a P-type silicon.

Figure 6:
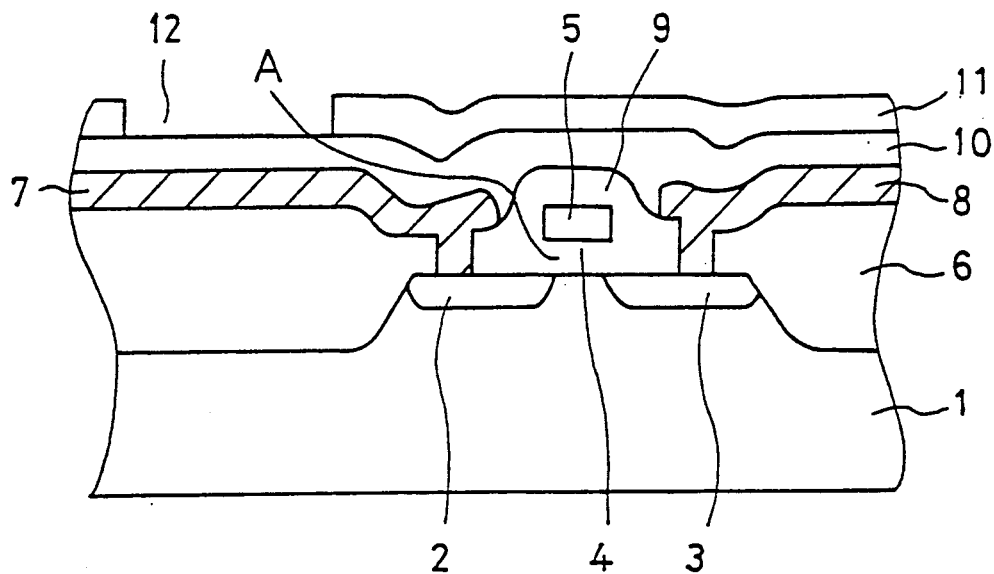
FIG. 6 is a cross sectional view of a semiconductor device according to the another embodiment.

FIG. 6 is a cross sectional view of a MOS semiconductor device according to another embodiment. An N+ type source region 2 and an N+ type silicon region are formed on the surface of a silicon substrate 1. A gate electrode 5 is formed on the surface of the substrate between the source region 2 and the drain region 3 through a gate oxide layer 4. A voltage is imposed on the respective regions through conductors such as aluminum wirings 7, 8. Further, a passivation layer is finally formed to prevent the invasion of foreign substances from the outside. The passivation layer of the present invention is formed of a first passivation layer 10 and a second passivation layer 11. The second passivation layer 11 is composed of a silicon nitride layer, the layer of which is so minute that it has a capacity to protect the semiconductor device against the invasion of water, hydrogen or the like. However, the silicon nitride layer 11 absorbs much hydrogen when it is formed and the hydrogen enters by diffusion into the gate silicon oxide 4. However, when hot electrons are produced between the source region 2 and the drain region 3, the hot electrons are trapped by the gate oxide layer 4 due to the hydrogen. More specifically, the MOS transistor has a characteristic that it changes with aging due to the trap. Thus, the present embodiment forms a layer through which hydrogen in the gate oxide layer 4 is released to the outside. That is, it is the first passivation layer. When a diffusion hole 12 is formed in the silicon nitride layer 11 which is difficult to diffuse hydrogen, the hydrogen in the gate oxide layer 4 can be released to the outside from the diffusion hole 12 through the first passivation layer 10 as shown by an arrow A. As shown in FIG. 6, the diffusion hole 12 is laterally spaced from and does not overlie the source and drain regions 2, 3 or the gate electrode 5. The hydrogen is difficult to be released through an internal insulator film or a field oxide layer 6 deposited under the aluminum wirings because the internal insulator film or the field oxide layer is generally processed at a temperature of 850° C. and it has a smaller hydrogen diffusing coefficient. Then, the present invention uses the silicon dioxide layer as the first passivation layer 10. Since the layer 10 is formed at a low temperature, i.e., at a temperature below 600° C., it has a large hydrogen diffusing coefficient.

Figure 7:
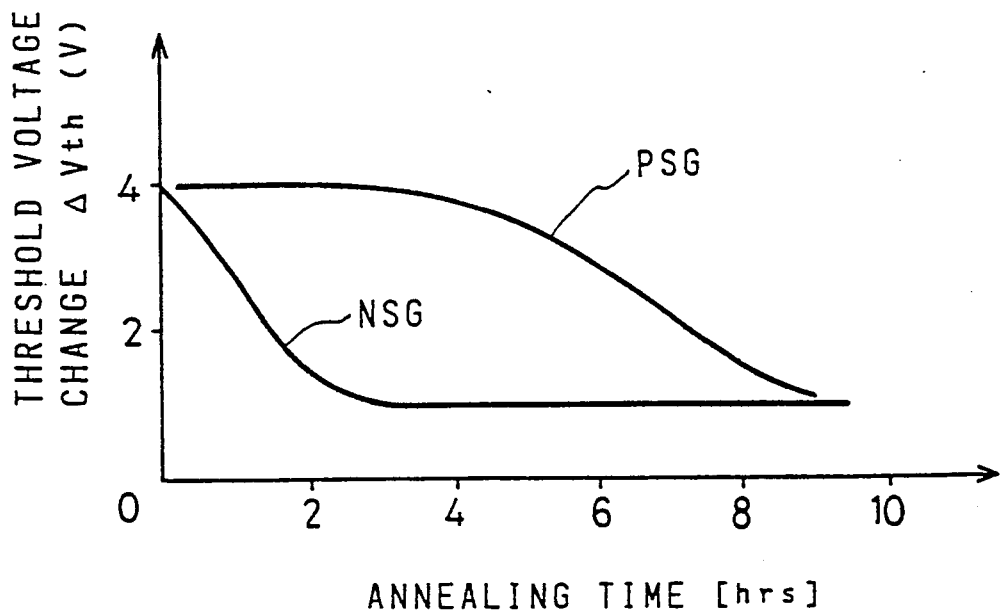
FIG. 7 is a diagram illustrative of a characteristic of a change in a threshold voltage caused by a hot electron trap and a passivation layer.
Figure 8:
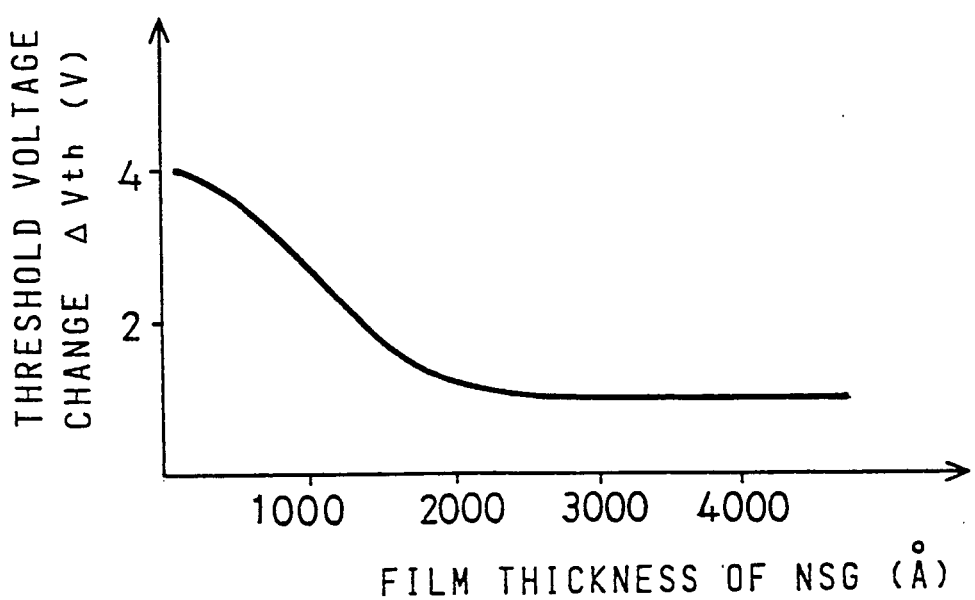
FIG. 8 is a diagram illustrative of a characteristic of a thickness of a passivation layer.

Therefore, the hydrogen in the gate oxide layer 4 can be released to the outside through the first passivation layer 10, as shown by the arrow, by annealing at a temperature of less than 300° C. which is less than the temperature of an aluminum alloy. The diffusion coefficient of the first passivation layer 10 composed of the silicon dioxide also depends on the phosphorus concentration in the layer. FIG. 7 is a graph illustrative of a reduction in a hot electron trap by annealing in the case of an NSG layer with phosphorus concentration of 0.5% or less and a PSG layer with phosphorus concentration of 3% or less. When the phosphorus concentration is 0.5% or less, hydrogen is quickly diffused and less deterioration is caused by the hot electron trap. In addition, the diffusion is enhanced by a thicker layer of the first passivation layer 10. FIG. 8 is a graph illustrative of a change $\Delta V_{TH}$ in a threshold voltage of the MOS transistor caused by the hot electron trap vs. a layer thickness. A layer thickness greater than 2000 Å can reduces the $\Delta V_{TH}$.

Although a cross section of the semiconductor device according to the present embodiment is shown in FIG. 6, it can release the hydrogen without specific process for forming the hole 12 for diffusing the hydrogen. More specifically, when the hole for diffusing hydrogen is provided in both the first and second passivation layers, the hole can be formed with a process for forming a pad which is a region for applying a voltage from the outside to IC chip.

As describe above, according to the present embodiment, a stable MOS type semiconductor device with less hot electron trap can be provided by a passivation layer composed of a first passivation layer for diffusing hydrogen and a second passivation layer consisting of a plasm nitride layer containing much hydrogen.

What is claimed is:

1. A MOS semiconductor device comprising:
a semiconductor substrate of a first conductivity type;
source and drain regions of a second conductivity type formed on a surface of the semiconductor substrate and spaced apart from each other;
a gate electrode formed on a surface portion of the semiconductor substrate between the source and drain regions through a gate insulator film;
an internal insulator film at least over the gate electrode; and
a passivation film at least over the internal insulator film, the passivation film being comprised of a first passivation layer and a second passivation layer formed on the first passivation layer, the first passivation layer being composed of silicon dioxide and containing not more than 0.5 percent phosphorous by atomic weight, and the second passivation layer being composed of silicon oxynitride or silicon nitride.

2. A MOS semiconductor device as claimed in claim 1; wherein the first passivation layer is formed at a temperature below 600° C.

3. A MOS semiconductor device as claimed in claim 1; wherein the first passivation layer has a film thickness of not less than 1500 Å.

4. A MOS semiconductor device as claimed in claim 1; wherein the second passivation layer has a hole for diffusing hydrogen.

5. A MOS semiconductor device comprising:
a semiconductor substrate of a first conductivity type;

source and drain regions of a second conductivity type formed on a surface of the semiconductor substrate and spaced apart from each other;

a gate electrode formed on a surface portion of the semiconductor substrate between the source and drain regions through a gate insulator film;

an internal insulator film at least over the gate electrode;

a field oxide layer disposed on the semiconductor substrate and surrounding the source and drain regions and the gate electrode;

aluminum wirings disposed on the field oxide layer and connected electrically to the source and drain regions; and a passivation film disposed over the internal insulator film and the field oxide layer, the passivation film being comprised of a first passivation layer and a second passivation layer formed on the first passivation layer, the first passivation layer being composed of silicon dioxide formed at a temperature below 600° C. and the second passivation layer being composed of silicon oxynitride or silicon nitride, the second passivation layer having a hole to expose a part of the first passivation layer but leaving the aluminum wirings unexposed for diffusing externally through the exposed part of the first passivation layer hydrogen contained in the device.

6. A MOS semiconductor device as claimed in claim 5; wherein the first passivation layer contains not more than 0.5 percent phosphorous by atomic weight and has a film thickness of not less than 1500 Å.

7. A MOS semiconductor device comprising:

a semiconductor substrate of a first conductivity type;

source and drain regions of a second conductivity type formed on a surface of the semiconductor substrate and spaced apart from each other;

a gate electrode formed on the surface of the semiconductor substrate between the source and drain regions through a gate insulator film;

another insulator film extending over at least the gate electrode; and a passivation film extending over at least the another insulator film, the passivation film comprising an outer layer composed of silicon nitride or silicon oxynitride for preventing invasion of foreign substances into the device but ineffective to prevent invasion of hydrogen when the device is exposed to an aqueous vapor atmosphere, and an inner layer composed to silicon dioxide disposed beneath the outer layer and containing not more than 0.5 atomic weight percent of phosphorous effective to absorb hydrogen that diffuses inwardly from the outer layer.

8. A device according to claim 7; wherein the inner layer has a thickness of at least 1500 Å.

9. A MOS semiconductor device comprising:

a semiconductor substrate of a first conductivity type;

source and drain regions of a second conductivity type formed on a surface of the semiconductor substrate and spaced apart from each other;

a gate electrode formed on the surface of the semiconductor substrate between the source and drain regions through a gate insulator film, the gate insulator film containing diffused hydrogen;

another insulator film extending over at least the gate electrode;

a field oxide layer formed on the semiconductor substrate and surrounding the source and drain regions;

conductors extending along the field oxide layer and electrically connected to respective ones of the source and drain regions; and a passivation film extending over the another insulator film, the conductors and the field oxide layer, the passivation film comprising an outer layer composed of silicon nitride or silicon oxynitride for preventing invasion of foreign substances into the device, and an inner layer composed of silicon dioxide disposed beneath the outer layer and containing not more than 0.5 atomic weight percent of phosphorous effective to absorb hydrogen diffused in the gate insulator film, the outer layer having an opening therein to expose a part of the inner layer, the opening being laterally spaced from the source and drain regions and the gate electrode and being effective to permit hydrogen absorbed in the inner layer to be released from the device through the opening.

10. A device according to claim 9, wherein the conductors are composed of aluminum.

11. A device according to claim 9; wherein the inner layer has a thickness of at least 1500 Å.

* * * * *